United States Patent [19]

Salsbury et al.

[11] 3,938,108

[45] Feb. 10, 1976

[54] ERASABLE PROGRAMMABLE READ-ONLY MEMORY

[75] Inventors: Phillip J. Salsbury, Sunnyvale; George Perlegos, Santa Clara, both of Calif.

[73] Assignee: Intel Corporation, Santa Clara, Calif.

[22] Filed: Feb. 3, 1975

[21] Appl. No.: 546,546

[52] U.S. Cl. ............. 340/173 R; 307/238; 307/279; 307/304
[51] Int. Cl.² G11C 11/40; H03K 5/00; H03K 3/26; H03K 3/353
[58] Field of Search .................. 340/173 R, 173 SP; 307/238, 279, 304; 330/30 D

[56] References Cited
UNITED STATES PATENTS

| | | |
|---|---|---|
| 3,641,512 | 2/1972 | Frohman-Bentchkowsky. 340/173 R |
| 3,728,695 | 4/1973 | Frohman-Bentchkowsky. 340/173 R |
| 3,747,072 | 7/1973 | Lodi et al. ........................ 340/172.5 |
| 3,846,768 | 11/1974 | Krick ............................... 340/173 R |
| 3,893,085 | 7/1975 | Hansen ........................... 340/173 R |
| 3,898,630 | 8/1975 | Hansen et al. .................. 340/173 R |

*Primary Examiner*—Daryl W. Cook
*Attorney, Agent, or Firm*—Spensley, Horn & Lubitz

[57] ABSTRACT

A TTL compatible erasable programmable read-only memory (PROM) which uses a single n-channel device having a floating gate for each memory cell. The entire memory including the periphery circuits, are disposed on a silicon substrate. Only a single externally generated high voltage input or "pin" is required for programming.

19 Claims, 6 Drawing Figures

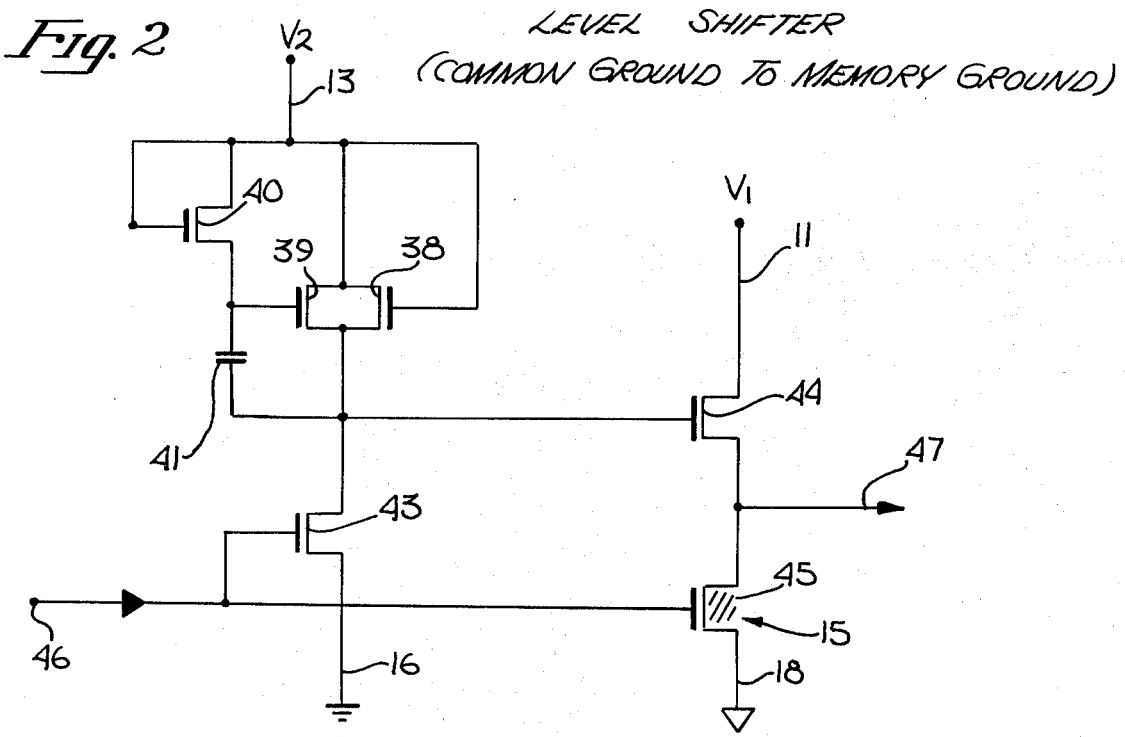
Fig. 2 LEVEL SHIFTER (COMMON GROUND TO MEMORY GROUND)
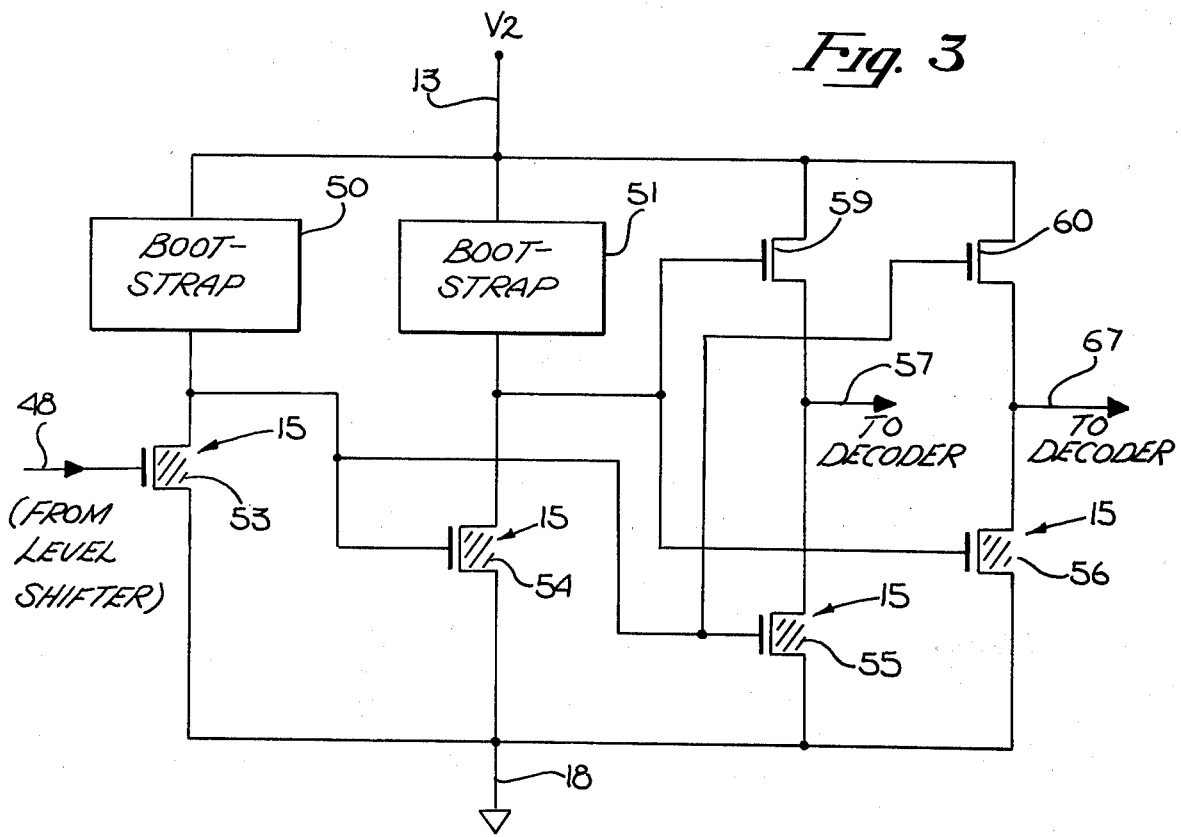
Fig. 3
PUSH PULL ADDRESS OUTPUT BUFFER

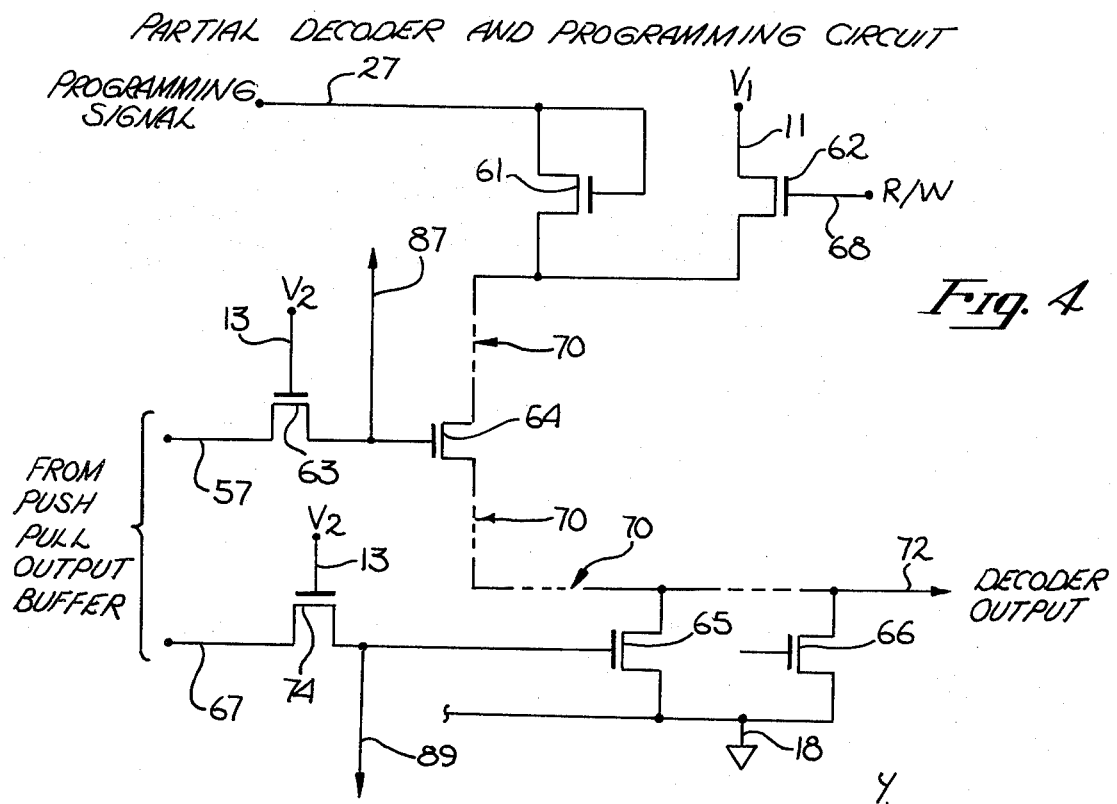
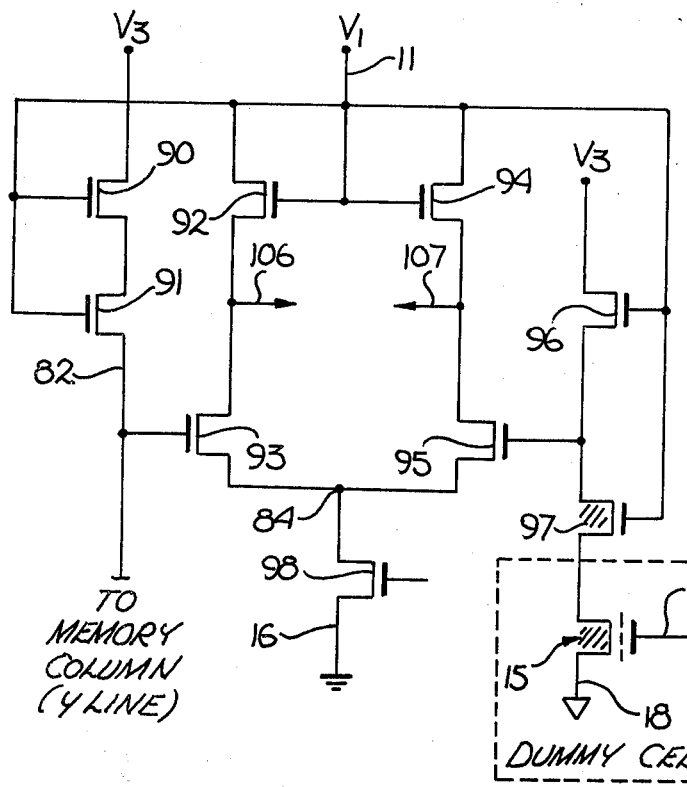
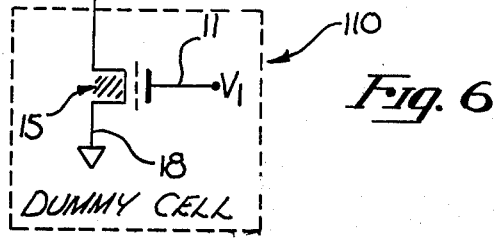

ERASABLE PROGRAMMABLE READ-ONLY MEMORY

BACKGROUND OF THE INVENTION

1. Field of the Invention

The invention relates to the field of erasable programmable read-only memories.

2. Prior Art

Programmable read-only memories including memories which are erasable both electrically and through the use of electromagnetic radiation are known in the prior art. One such memory is shown in U.S. Letters Pat. No. 3,744,036. A memory such as shown in this patent is commercially available. This memory uses p-channel floating gate devices as memory elements which are programmed through avalanche injection, and thus voltages in the order of magnitude of 30 – 40 volts are required for programming.

U.S. Letters Pat. No. 3,728,695 discloses other circuits for erasable PROM's.

SUMMARY OF THE INVENTION

A read-only memory is disclosed which is deployed on a doped silicon substrate. The substrate includes a first region which is more highly doped than the remainder of the substrate. A plurality of memory cells are disposed in the first region. Each of the memory cells includes a floating gate for storing charge. A plurality of buffers are disposed on the substrate, spaced apart from said first region, and are used for communicating signals to the memory cells. Each of the buffers include field-effect transistors having channels with a first level of dopant and at least one field-effect transistor having a channel with a second level of dopant, where the second level of dopant is higher than the first level. The buffers act as level shifters to permit signals to be readily transmitted to the memory cells and assure TTL compatibility.

BRIEF DESCRIPTION OF THE DRAWINGS

FIG. 2 is a circuit diagram illustrating the level shifting circuit utilized in the invention.

FIG. 3 is a circuit diagram illustrating the push-pull address output buffers utilized in the memory.

FIG. 4 is a partial circuit diagram illustrating the decoding programming circuit.

FIG. 5 is a partial section of the memory array used to illustrate a single cell in the array.

FIG. 6 is a circuit diagram of the differential sensing amplifier and output level shifter used in the memory.

DETAILED DESCRIPTION OF THE INVENTION

Figure 1:
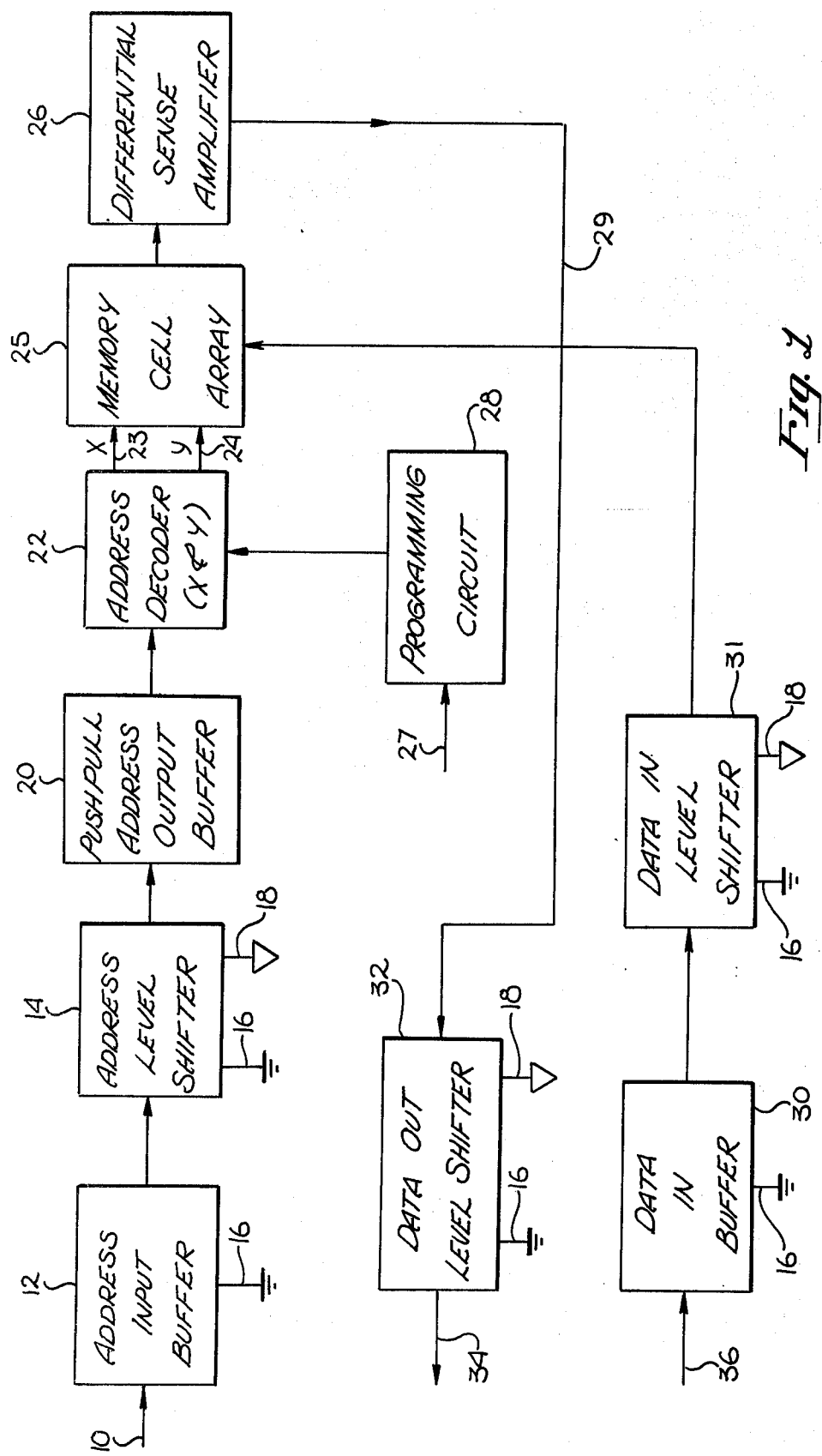
FIG. 1 is a block diagram of the presently preferred embodiment of the invented memory.

The memory system of the present invention is an erasable programmable read-only memory suitable for storing binary information. While the capacity of the memory (and other details which are disclosed) are not critical for the present invention, the presently preferred embodiment includes an array having 8,192 memory cells, each cell being adaptable for storing a single bit in the form of an electrical charge stored on a floating gate. The memory is nonvolatile in that the charge will remain stored without refreshing for many years, although it may be erased thus allowing programming. In the presently preferred embodiment the entire memory including the peripheral circuits and the array of memory cells are disposed on a single p-type conductivity silicon substrate. Access times for the presently disclosed memory are considerably better than the prior art erasable programmable read-only memories and in the order of magnitude of approximately 200–300 nanoseconds.

The memory cells of the memory each include a single element device, unlike prior art erasable PROM's where a gating device is used in conjunction with a floating gate device. The single element device allows the array to be fabricated more densely, and hence at a lower cost. While other memory cells may be utilized, the presently preferred memory cell is discussed in copending application Ser. No. 537,265, filed Dec. 30, 1974, assigned to the assignee of the present application.

Referring first to FIG. 5, a single memory cell is shown connected to an X-line 76 and a Y-line 75. It will be appreciated that the memory cell array 25 shown in FIG. 1 comprises a plurality of X-lines, a plurality of Y-lines and a plurality of cells such as the cell illustrated in FIG. 5. The memory cell of FIG. 5 is an n-channel device which includes a drain terminal 80 (coupled to the Y-line 75) and a source region 81 (coupled to the memory ground 18). The memory cell includes a floating gate 79 disposed between the substrate 81a and a control gate 78. The control gate is connected to the X-line 76.

The substrate upon which the memory is fabricated includes regions which are more heavily doped with a p-type dopant than are other regions of the surface of the substrate as described in the above-referenced copending application. In the presently preferred embodiment the area of the substrate which forms the host material for the memory cell array 25 of FIG. 1 is ion implanted with p-type dopant so that the concentration level of the dopant is higher than the substrate. Thus, all the memory cells, such as the one illustrated in FIG. 5, are completely fabricated in this more heavily doped region. In the periphery circuitry, as will be discussed, certain of the field-effect transistors have their channels ion implanted so that the channels are more heavily doped with p-type dopant. The channels of these field-effect transistors are identified in the drawings by the lined regions 15. The more heavily doped region which forms the host material for the cells and the ion implanted channels of those field-effect transistors which have more heavily doped channels are fabricated simultaneously. The memory substrate includes channel stops which are fabricated utilizing known technology in order to separate the more heavily doped host region for the cells from the remainder of the memory. The above-described memory and its method of fabrication are described in more detail in the above-referenced co-pending application.

The memory cell utilized in the presently preferred embodiment is programmable with lower voltages than those required by prior art avalanche injection devices. The memory cell of FIG. 5 may be programmed with the application of a voltage of approximately 25 volts to the control gate 78 and approximately 20 volts to the drain terminal 80. With these conditions are met electrons are transferred onto the floating gate 79 and remain on the floating gate until it is erased. The memory cell will have a threshold of approximately 4 volts (control gate 78 to source) when the floating gate 79 is uncharged as compared with a threshold of approximately 12 volts when the floating gate 79 is charged.

The above voltages are given by way of example and are generally applicable to the n-channel cell used in the presently preferred embodiment. It will be appreciated that if a p-channel device is utilized different polarities and voltages may be utilized.

It is desirable in the operation of many MOS circuits to utilize substrate biasing. This biasing in addition to other advantages, provides threshold levels compatible with external circuitry, particularly with TTL circuitry. However, the presently preferred memory cells, if biased, would require higher voltages to operate effectively because of the "body effect" associated with the more heavily doped region upon which the cells are fabricated. This more heavily doped region is desirable though since it permits the programming of the memory cells with voltages which are substantially less than those associated with prior art avalanche injection devices.

There are other characteristics of the presently preferred memory cell which require consideration in the design of a memory utilizing such devices. The floating gate of the memory cell tends to charge slowly under certain conditions, hence, these conditions must be avoided. One of these conditions occurs during reading when the sourcedrain voltage exceeds approximately 3 volts. Another of these conditions occurs during programming when either the control gate voltage is high, or the drain voltage is high. For this latter condition, slow programming will occur unless the gate to source voltage is approximately equal to or less than one volt.

To overcome some of the limitations of constraints dictated by the memory cell, the presently disclosed memory system utilizes two separate grounds. Referring to FIG. 1, two separate ground are illustrated, one of these grounds shall be referred to as the common or external ground 16 and the other the substrate or memory ground 18. The common or external ground 16 may be common with external grounds, such as the grounds associated with the power supplies used to operate the memory, and common with the circuits which interface with the memory. The substrate or memory ground 18 is held at a potential of approximately −5 volts when compared to the common ground. The substrate and source regions for the memory cells, such as the memory cell illustrated in FIG. 5, are coupled to the memory ground 18, thus the memory cells have no substrate biasing, however the field-effect transistors of the peripheral circuit are biased.

Referring to FIG. 1 and the general block diagram of the memory, the address inputs to the memory are shown as line 10. In the presently preferred embodiment line 10 comprises a plurality of leads for receiving the bits of an address. Another input to the memory is the high voltage (20 – 25 volts) programming signal which is applied to line 27. In the presently preferred embodiment only a single high voltage signal is required for a duration of approximately 100 milliseconds to program an addressed cell. This signal is synchronized with the address signals applied to line 10 and with the data-in signal applied to line 36 for programming. Other inputs to the memory not illustrated in FIG. 1, but which are referred to in the other figures, are the power supply voltages. The output from the memory is shown as line 34 and the information appearing on this line as is the case with read-only memories, is representative of the program stored in the memory.

The address received on line 10 are applied to the address input buffer 12. This buffer which is referenced to the external or common ground 16 may be fabricated utilizing known circuits including those providing TTL compatibility. The data-in buffers 30 which receive data on line 36 may be similar in construction to buffer 12 and hence may be any one of numerous prior art buffers. Buffer 30 is also reference to the external or common ground 16, thus the buffer 30 may readily interface with external circuitry. It will be appreciated that as is the case with other memories, a plurality of address buffers 12 and for that matter, a plurality of address level shifters 14, push-pull address output buffers 20 and address decoders 22 are utilized, the number being determined by the number of bits in the address which are to be decoded.

The address level shifter 14 is utilized to shift the reference level of the address from the common ground 16 to the memory ground 18. The data-in level shifter 31 serves the same function as the address level shifter 14 and shifts the level of the incoming data from the common ground 16 to the memory ground 18. A level shifter for performing this function shall be discussed in detail in conjunction with FIG. 2.

The output of the address level shifter 14 is communicated to a push-pull address output buffer 20. The output of the buffer 20 is utilized to drive the address decoder 22. The function of the push-pull address output buffer will be discussed in detail in conjunction with FIG. 3.

The address decoder 22 serves to decode the address; the general design of decoder 22 is similar to decoders used in prior art memory circuits. The decoder of the presently preferred embodiment utilizes a plurality of parallel and series field-effect transistors for decoding an address. The output from decoder 22, X-line 23 and Y-line 24, are one of the plurality of X-lines and Y-lines defining the array 25 along the memory cells.

The differential sense amplifier 26 is used for reading data from the array 25 by sensing potentials on the column lines from the array. One such amplifier is connected to each column of the array. The amplifier 26 utilized in the presently preferred embodiment will be discussed in detail in conjunction with FIG. 6. The output from the differential sense amplifier 26 is coupled by line 29 to a data-out level shifter 32. The level shifter 32 converts the level of the output data from the memory ground 18 to the common ground 16. The level shifter 32 in the presently preferred embodiment is an integral part of the differential sense amplifier 26 and thus will be discussed in conjunction with FIG. 6.

The programming circuit 29 operates in conjunction with the address decoders to route the high voltage programming signal (line 27) to a selected cell. The programming circuit shall be discussed in conjunction with the address decoders which are partially shown in FIG. 4.

Referring to FIG. 2, the level shifter includes an input line 46 which may be the output from the address input buffer 12 of FIG. 1 or the output from the data-in buffer 30 of FIG. 1. The output from the level shifter of FIG. 2 is line 47. This output line is coupled to the push-pull address output buffer 20, or to the memory cell array 25 where the shifter is utilized for shifter 31 of FIG. 1. The level shifter includes a bootstrap circuit which comprises transistors 38, 39, 40 and capacitor 41. These transistors and the other transistors of the memory are n-channel enhancement mode, field-effect transistors employing polycrystalline silicon gates in the presently preferred embodiment. The drains of transistors 38, 39 and 40 along with the gates of transistors 38 and 40, are coupled to a source of positive potential, $V_2$ (line 13) which in the presently preferred embodiment is approximately 12 volts. The source of transistor 40 is coupled to the gate of transistor 39. One terminal of capacitor 41 is coupled to the gate of transistor 39, the other terminal of capacitor 41 and the sources of transistors 38 and 39 are connected to a common node which includes the gate of transistor 44 and the drain of transistor 43. The source of transistor 43 is coupled to the common ground 16. The gate of transistor 43 along with the gate of transistor 45 are coupled to the input line, line 46. The source of transistor 45 is coupled to the memory ground 18; the drain of transistor 45 is coupled to the source of transistor 44, this node being common with line 47. The drain of transistor 44 is coupled to a source of positive potential $V_1$, (line 11) which in the presently preferred embodiment is approximately 5 volts.

The channel of transistor 45 includes a more highly doped region 15. Since the channel of transistor 45 is more heavily doped its threshold is shifted and it requires a greater gate-to-source voltage for conduction. This transistor even though its source is referenced to ground 18 only slightly conducts when its gate is at the potential of ground 16.

First examining the case when a positive signal is applied to line 46, transistor 45 will conduct heavily, and hence the source of the output transistor 44 and the voltage on line 4 will be at approximately memory ground 18. Since transistor 43 is conducting, the gate of transistors 44 is at approximately common ground. For these conditions transistor 44 will conduct, although not heavily.

On the other hand, when line 46 is at the common ground 16 potential the gate of transistor 39 is bootstrapped so as to cause transistor 44 to readily conduct while at the same time transistor 45 is only slightly conducting. Under these conditions the voltage on line 47 is pulled towards voltage $V_1$. The potential on line 47, by way of example, vaires from approximately +3 volts to −4 volts when compared to the common ground, or when compared to the memory ground from approximately 1 volt to approximately 8 volts.

As previously mentioned, the output of the address level shifter is utilized as an input to the push-pull address output buffer. The output from this buffer is used to drive the decoding circuitry. In FIG. 3 the input to the push-pull address output buffer is shown as line 48 and the output as lined 57 and 67. The buffer receives power from line 13, and is grounded to the memory ground 18. The input line 48 is coupled to the gate of transistor 53; the drain of transistor 53 is coupled to line 13 through a bootstrap circuit 50 and also to the gates of transistors 54, 55 and 60. The sources of transistors 53, 54, 55 and 56 are coupled to the memory ground 18. The drain of transistor 54 is coupled to the gate of the output transistor 59, to the gate of transistor 56 and to a bootstrap circuit 51. The bootstrap circuits 50 and 51 may be ordinary bootstrap circuits known in the art; bootstrap circuit 50 is used to boost the gate potential of transistors 54, 55 and 60 while bootstrap circuit 51 is used to boost the gate potential on transistors 56 and 59. Transistors 53, 54, 55 and 56 have their channels ion implanted as indicated by regions 15. Note that if these devices were not ion implanted their thresholds would be approximately 0.25 volts with reference to the memory substrate, and transistor 53 would continuously conduct since the signal appearing on line 48 would not be sufficiently low to prevent conduction.

In the circuit of FIG. 3 when a high level signal appears on line 48, it causes transistor 53 to conduct heavily, thereby bringing the drain voltage of transistor 53 to approximately the potential of ground 18. This potential at the drain of tansistor 53, since it is coupled to the gates of transistors 54 and 55, causes transistors 54 and 55 to cease conducting. When transistor 54 ceases to conduct bootstrap circuit 51 raises the potential on the gate of transistor 59 in excess of the voltage $V_2$, thereby driving line 57 to $V_2$. This bootstrap potential also causes transistor 56 to heavily conduct, thus line 67 is clamped to ground 18. When the signal applied to line 48 is in its low state transistor 53 ceases to conduct heavily. When this occurs bootstrap circuit 50 raises the potential on the gates of transistors 54, 55 and 60 to a potential in excess of $V_2$. This raises the potential on line 67 to $V_2$ and clamps line 57 to ground 18.

Referring to FIG. 4 a partial drawing of a decoder and portions of the programming circuitry are illustrated. The decoder utilized in the presently preferred embodiment includes series transistors which receive one output from the push-pull address buffers (FIG. 3) on address and parallel transistors which receive the other push-pull output (the complement). In FIG. 4 one series of decoding transistor 64 and two parallel decoding transistors 65 and 66 are illustrated. Broken line 70 are used to indicate that other series and parallel transistors are part of the decoder. It will be appreciated that each output of each push-pull buffer is coupled to a series or parallel decoding transistor of either a row or column decoder in order that an address may be decoded. For purposes of discussion it will be assumed that one output from the buffer shown in FIG. 3, line 57, is coupled to the gate of series decoding transistor 64 through transistor 63, and the other buffer output line 67 is coupled to the gate of parallel decoding transistors through transistor 74.

The decoding circuitry is utilized for selecting cells in the array both for programming and for reading. Thus, the decoder must be able to transmit the higher voltage associated with programming. Moreover, the output from the decoder (line 72) for an unselected line in the array must be close to potential 18. As previously discussed, a cell not selected for programming, will slowly program unless its gate to source potential is approximately 1 volt or less. Those output lines from the decoder which form the X-lines of the array are held at the potential as will be seen. Also, to allow unambiguous Y-selection those decoder output lines which form the Y-lines of the array during reading are held at the potential of ground 18 (for unselected Y-lines). This prevents the source-to-drain potential of unselected cells disposed along a selected X-line from rising.

In FIG. 4 the gates of transistors 63 and 74 are coupled to $V_2$, liine 13. The series transistors in the decoder are coupled to one terminal of transistors 61 and 62. The other terminal and gate of transistor 61 is coupled to the source of the programming signal, line 27. The other terminal of transistor 62 is coupled to line 11 ($V_1$) while the gate of transistor 62 is coupled to line 68, a read-write signal. This signal is high or positive when information is read from the memory and low when the memory is being programmed.

When stored data is being read from the memory (assuming the decoder of FIG. 4 has been activated by an address) the voltage $V_1$, which is coupled to the drain of transistor 62, will be coupled to the output line 72. This occurs since the series decoding transistors are conducting and the parallel decoding transistors are not conducting. On the other hand, if all the series decoding transistors do not conduct, and hence one or more of the parallel decoding transistors conduct, line 72 is clamped to ground 18.

During the programming cycle (assuming a selected decoder) the high voltage appearing on line 27 will be transmitted from that line onto the decoder output line 72. Bootstrap circuits (not illustrated) are coupled to each of the gates of the series decoding transistors (by line 87 for transistor 64) such that the gates of these transistors during programming are raised in potential in order that the programming signal on line 27 will pass through these series transistors. This bootstrapping circuit only raises the potential on the gates for the selected decoders, hence the bootstrapping circuit is address controlled.

Line 89, which is coupled to the gate of the parallel decoding transistor 7, is coupled to a bootstrapping circuit as was the case with line 87. While the gate of the parallel transistors does not require bootstrapping these gates are common with the gates of series decoding transistors (in other decoders) which do require the bootstrapped potential. Transistor 74 serves the same function as transistor 63 and prevents the high potential on line 89 from reaching the push-pull buffer. Transistor 63 acts as a transmission gate and prevents the high potential on line 87 during programming from flowing back into the push-pull buffer. Note that without transistors 63 and 74 the higher programming voltage would break down the more heavily doped transistors 55 and 56 of the push-pull buffer.

The data-in signal (line 36 of FIG. 1) is utilized to gate the programming signal (line 27) into the Y-lines of the array through ordinary circuitry not shown. By way of example, if a binary 1 exists on line 36 during programming the high voltage programming signal on line 27 (FIG. 4) is coupled to the drain of the selected cell. During reading a potential is placed on the selected X-line and a potential of approximately −2 volts (relative to the common ground) is placed on the selected Y-line. If the floating gate is not charged current will flow from the Y-line to the memory ground thereby causing a drop in potential on the selected Y-line. If, on the other hand, the floating gate has been charged, the Y-line will not discharge or its rate of discharge will be very slow.

A differential sensing amplifier (FIG. 6) for sensing the state of the memory cells is coupled to each of the Y-lines in the array. This amplifier also shifts the level of data as shown by level shifter 32 of FIG. 1. In FIG. 6 a Y-line or column of the array is illustrated as line 82. One end of the line is coupled to the potential $V_3$ (−2 volts) during reading through resistors 90 and 91. The differential amplifier includes two branches coupled between the potential $V_1$ (line 11) and a common node 84. The first branch includes series transistors 92 and 93, and the other includes series transistors 94 and 95. The common node 84 is coupled through transistor 98 to the common ground 16. Transistors 92 and 94 which are loads for the branches of the amplifier have their gates coupled to line 11. The output from the amplifier, lines 106 and 107, in the presently preferred embodiment are coupled to a second stage, this second stage may be an ordinary differential amplifying stage coupled to the common ground 16. The output from this second stage may be buffered before being coupled to line 34 (FIG. 1).

One branch of the differential amplifier is coupled to the column line in the array through the gate of transistor 93, while the other branch is coupled to the gate of transistor 95 to a circuit which includes a dummy cell. The gate of transistor 95 is coupled to the potential $V_3$ through transistor 96 and to the drain of transistor 97. Transistors 90, 91, 96 and 97 have their gates coupled to $V_1$. The source of transistor 97 is coupled to the dummy cell. The dummy cell 110 is a memory cell such as the one illustrated in FIG. 5 used for providing a reference level for the differential amplifier. Dummy cell 110 is fabricated with the memory cells of the array in the more highly doped region of the substrate. The floating gate of the dummy cell is not charged, hence the dummy cell 110 conducts more readily than if the gate were charged.

Transistors 90 and 91 act as a load on the column line; of the Y-line is coupled to a conducting (selected) memory cell the gate of transistor 93 is pulled towards ground. Transistors 96 and 97 likewise act as loads, but since the dummy cell 110 is always unprogrammed the gate of transistor 95 remains at a predetermined potential. The amplifier operates on the differences between the gate voltage of transistor 93 and the gate voltage of transistor 95. Thus, if line 82 is coupled to an unprogrammed memory cell, the gate of transistor 93 will drip below the gate potential of transistor 95 causing transistor 93 to conduct less than transistor 95. For the case where line 82 is coupled to a programmed cell, the opposite would occur, that is, the potential on the gate of transistor 93 would rise compared to the potential on the gate of transistor 95. The differences in potential on lines 106 and 107 are amplified by the second stage (not shown) and the resultant signal may be read from the memory. Transistor 98 is gated to save power when the amplifier is not in use.

In order to assure that the dummy cell provides a reliable reference signal, this cell is disposed in the more heavily doped region of the substrate which includes the memory cells, and moreover, the dimensions of this device are the same as those of a memory cell. The dummy cell is also aligned with the memory cells in the array such that its floating gate and control gate are aligned with like layers of the memory cells.

Thus, a memory system has been disclosed in which the memory array includes a plurality of memory cells each consisting of a single element or device having a floating gate. The cells are fabricated on the same substrate with the periphery circuit, the cells being fabricated in a more heavily doped region than the remainder of the circuitry. The disclosed programmable read-only memory may be erased, in the presently preferred embodiment, by subjecting it to ultraviolet radiation. This removes charge from the floating gate, thus allowing reprogramming. Since the memory cells each only contain a single device, the array may be considerably denser than prior art arrays.

We claim:

1. A read-only memory deployed on a doped silicon substrate comprising:
   a first region on said substrate having a higher dopant level than said substrate;

a plurality of memory cells disposed in said first region, each of said cells including a floating gate for storing charge;

a plurality of buffers disposed on said substrate, spaced apart from said first region, for communicating signals to said memory cells, each of said buffers including a plurality of field-effect transistors having channels with a first level of dopant and at least one field-effect transistor having a channel with a second level of dopant wherein said saecond level of dopant is higher than said first level of dopant;

whereby said buffers act as level shifters to permit signals to be readily transmitted to said memory cells.

2. The memory defined by claim 1 wherein said first level of dopant is equal to the level of dopant of said doped silicon substrate.

3. The memory defined by claim 1 wherein in each of said buffers one of said transistors with said first level of dopant is connected on series with said transistor of said second level of dopant, and wherein the gate of said transistor with said second level of dopant received a buffered input signal referenced to external ground.

4. The memory defined in claim 3 wherein said one of said transistors with said first level of dopant has its gate coupled to a bootstrap circuit.

5. The memory defined in claim 1 wherein said buffers receive signals representative of an address, and wherein the output of each of said buffers is coupled to an address buffer comprising a plurality of transistors having channel with said first level of dopant and a plurality of transistors having channel with said second level of dopant.

6. The memory defined by claim 5 wherein the output from each of said address buffers comprises an output signal and its complement.

7. The memory defined in claim 6 including a plurality of decoders for deccoding an address, said decoders being coupled to said address buffers.

8. The memory defined in claim 7 including a terminal for receiving a programming signal for charging said floating gates of said memory cells.

9. The memory defined in claim 8 wherein said terminal is coupled to said cells through said decoders.

10. The memory defined in claim 9 wherein each of said decoders include a plurality of decoding transistors in series, said decoding transistors including gates coupled to receive said outputs of said address buffers.

11. The memory defined in claim 10 including bootstrapping means for bootstrapping said gates of said decoding transistors so that said decoding transistors will pass said programming signal.

12. The memory defined in claim 7 wherein said decoders are couples to said address buffers through a transfer gate such that a high voltage applied to said buffers is not transmitted to said address buffers.

13. The memory defined in claim 1 wherein the level of dopant of said first region is equal to said second level of dopant.

14. In a semiconductor memory disposed on a single silicon substrate and which includes a plurality of storage memory cells each of which has a floating gate for storing charge, a sense amplifier coupled to said cells comprising:

a first branch which includes a first load means and a first transistor, said first transistor being coupled to said storage memory cells;

a second branch coupled in parallel with said first branch, said second branch including a second load means and a second transistor;

a memory cell for establishing a reference potential, said memory cell including a floating gate, said memory cell being coupled to said second transistor;

whereby the reference potential provided by said memory cell establishes a level for said sense amplifier.

15. The amplifier defined by claim 14 wherein each of said storage memory cells and said memory cell for establishing a reference potential have the same dimensions.

16. The amplifier defined by claim 15 wherein said first and second load means each comprise load transistors.

17. The amplifier defined by claim 16 wherein said load transistor, said first and second transistors, said storage memory cells and said memory cell for establishing a reference potential all comprise n-channel devices.

18. A memory circuit having a plurality of floating gate MOS memory cells fabricated on a single silicon substrate comprising:

means for establishing a predetermined substrate voltage, said substrate voltage being coupled to each of said cells;

means for establishing an external reference voltage difference from said substrate voltage;

a a first buffer circuit including a first FET having a channel having a first predetermined dopant level, said first FET being biased with respect to said external reference voltage;

a level shifter having its input coupled to said first buffer circuit, said level shifter including a second FET having a channel having a second predetermined dopant level higher than said first predetermined dopant level, and a third FET, series-coupled to said second FET, having a channel having said first predetermined dopant level, said level shifter providing its output from said third FET;

a second buffer circuit coupled to the output of said level shifter, including a fourth FET having a channel having said first predetermined dopant level series-coupled to a fifth FET having a channel having said second predetermined dopant level, said second buffer circuit providing its output from said fifth FET said fifth FET being biased with respect to said substrate voltage.

19. The memory circuit of claim 18 further defined by the addition of a decoder circuit including a sixth FET having a channel having said first predetermined dopant level, the input of said decoder circuit being coupled to the output of said second buffer circuit and the output of said decoder circuit being coupled to each of said memory cells; and mean for coupling a programming signal to said decoder circuit through said sixth FET, said programming signal having a voltage level having an absolute value greater than either said substrate voltage or said external reference voltage.

* * * * *